(12) United States Patent
Chen et al.

(10) Patent No.: US 7,261,571 B2
(45) Date of Patent: Aug. 28, 2007

(54) ELECTRICAL CONNECTOR

(75) Inventors: Li-Bang Chen, Tu-Cheng (TW); Sung-Pei Hou, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/512,826

(22) Filed: Aug. 30, 2006

(65) Prior Publication Data

US 2007/0049096 A1    Mar. 1, 2007

(30) Foreign Application Priority Data

Aug. 30, 2005    (TW) .............................. 94214881 U

(51) Int. Cl.
    *H01R 12/00*    (2006.01)
(52) U.S. Cl. ...................................... 439/68
(58) Field of Classification Search ............ 439/68–71, 439/73, 330, 342, 343
    See application file for complete search history.

(56) References Cited

U.S. PATENT DOCUMENTS

| | | | | |
|---|---|---|---|---|
| 5,573,418 A * | 11/1996 | Matsuoka | ................... | 439/331 |
| 5,911,897 A * | 6/1999 | Hamilton | ................... | 219/497 |
| 6,218,849 B1 * | 4/2001 | Kiyokawa | ................... | 324/755 |
| 6,323,665 B1 * | 11/2001 | Johnson et al. | ............. | 324/760 |
| 6,744,269 B1 * | 6/2004 | Johnson et al. | ............. | 324/760 |
| 6,768,330 B2 * | 7/2004 | Huang | ........................ | 324/755 |
| 6,932,635 B2 * | 8/2005 | Ishikawa et al. | ............ | 439/190 |
| 6,965,246 B2 * | 11/2005 | Gattuso et al. | ............. | 324/760 |
| 7,038,919 B2 * | 5/2006 | McHugh et al. | ............ | 361/785 |
| 7,187,189 B2 * | 3/2007 | Lopez et al. | ................. | 324/760 |
| 2003/0003781 A1 * | 1/2003 | Groot | .......................... | 439/70 |
| 2005/0012516 A1 * | 1/2005 | Hou | ............................ | 324/765 |
| 2005/0068753 A1 * | 3/2005 | McHugh et al. | ............ | 361/785 |
| 2005/0206368 A1 * | 9/2005 | Lopez et al. | ............. | 324/158.1 |
| 2005/0231224 A1 * | 10/2005 | Gattuso et al. | ............. | 324/760 |
| 2006/0145718 A1 * | 7/2006 | Lopez et al. | ................. | 324/760 |
| 2006/0290370 A1 * | 12/2006 | Lopez | ........................ | 324/765 |
| 2007/0075721 A1 * | 4/2007 | Lopez et al. | ................ | 324/765 |

* cited by examiner

*Primary Examiner*—Ron Gushi
(74) *Attorney, Agent, or Firm*—Wei Te Chung

(57) ABSTRACT

An IC socket for electrically connecting an integrated circuit module to a printed circuit board comprises: an insulative housing defining two pairs of sidewalls, said sidewalls forming a recessed area defining a plurality of passageways therein, one of the sidewalls of the housing forms a receiving channel and a fastening channel communicating with the receiving channel; a plurality of conductive contacts received in corresponding passageways; and a fastener to be mounted in the fastening channel, the improvement wherein: a separate sleeve is interferentially disposed in the fastening channel and the fastener is screwed in the sleeve.

9 Claims, 6 Drawing Sheets

ELECTRICAL CONNECTOR

CROSS-REFERENCE TO RELATED APPLICATIONS

The subject matter disclosed and claimed herein is related to the subject matter disclosed and claimed in U.S. Pat. No. 7,038,919.

FIELD OF THE INVENTION

The present invention relates to an electrical connector capable of retaining a sensor therein, and particularly relates to an integrated circuit (IC) test socket having a fastening mechanism for reliably retaining a sensor.

BACKGROUND OF THE INVENTION

Electronic packages, such as integrated circuits (ICs), are miniaturized electronic devices in which a number of active and passive circuit elements are located on or within a continuous body of material to perform the function of a complete circuit. To ensure reliability of ICs prior to marketing, they are required to be burned in. That is, the ICs are operated at high temperature for an extended period of time in order to accelerate any dormant failure mechanisms that may be present. This is intended to eliminate early product failures once the ICs are sold and assembled into end products. A burn-in socket is used to receive an IC therein, so that the IC is electrically connected with a burn-in board.

Conventional IC sockets are disclosed in U.S. Pat. Nos. 5,609,497 and 5,100,332. Each typical such kind of IC socket comprises a base, a cover pivotally mounted on one side of the base, and a plurality of electrical contacts received in the base. The base comprises a loading table in a middle thereof for loading an IC thereon, and a lip on an end thereof. The contacts are mounted around the loading table. Each contact comprises a flexible contact portion exposed above a top of the base, and a tail exposed below a bottom of the base. Therefore, the tail is liable to be damaged during shipping of the IC socket. The cover comprises a frame mounted on the base, a securing portion mounted in a middle of the frame, and a hook movably mounted on an end of the frame. The hook comprises a clasp on an end thereof, for engaging with the lip of the base. The securing portion defines a general rectangular cavity, and provides pressing portions around the cavity.

In use, firstly the cover is oriented perpendicularly to the base. The IC is attached on the loading table of the base, and a lead of each circuit of the IC is attached on the contact portion of a corresponding contact. Then, the cover is rotated downwardly to a horizontal position, with the clasp of the hook clasping a bottom of the lip. The IC is accommodated within the cavity of the cover, and the pressing portions of the cover firmly press on the IC. The tails of the contacts are electrically connected with a burn-in board, thereby electrically interconnecting the IC with the burn-in board. During the burning-in period, a sensor is required to be attached to the IC socket, in order to provide an operator with burn-in data such as a temperature of the ambient environment and a position of the IC engaged on the IC socket.

However, conventional IC sockets do not provide any convenient fastening mechanism for attaching the sensor. The operators may have to resort to using means such as adhesive tape in order to attach the sensor on the IC socket. This does not provide reliable positioning of the sensor, and may reduce the accuracy of the burn-in data.

The above cross-referenced proposed a design intending to solve the above-mentioned disadvantages. However, further improvement can be made thereto in order to obtain a more durable test socket.

SUMMARY OF THE INVENTION

Accordingly, a primary object of the present invention is to provide an IC socket having a fastening mechanism for directly attaching a sensor thereto.

In order to achieve the abovementioned object, an IC socket in accordance with a preferred embodiment of the present invention comprises: an insulative housing defining two pairs of sidewalls, said sidewalls forming a recessed area defining a plurality of passageways therein, one of the sidewalls of the housing forms a receiving channel and a fastening channel communicating with the receiving channel; a plurality of conductive contacts received in corresponding passageways; and a fastener to be mounted in the fastening channel, the improvement wherein:

a separate sleeve is interferentially disposed in the fastening channel and the fastener is screwed through the sleeve.

Other objects, advantages and novel features of the present invention will become more apparent from the following detailed description when taken in conjunction with the accompanying drawings, in which:

DESCRIPTION OF THE PREFERRED EMBODIMENTS

Figure 1:
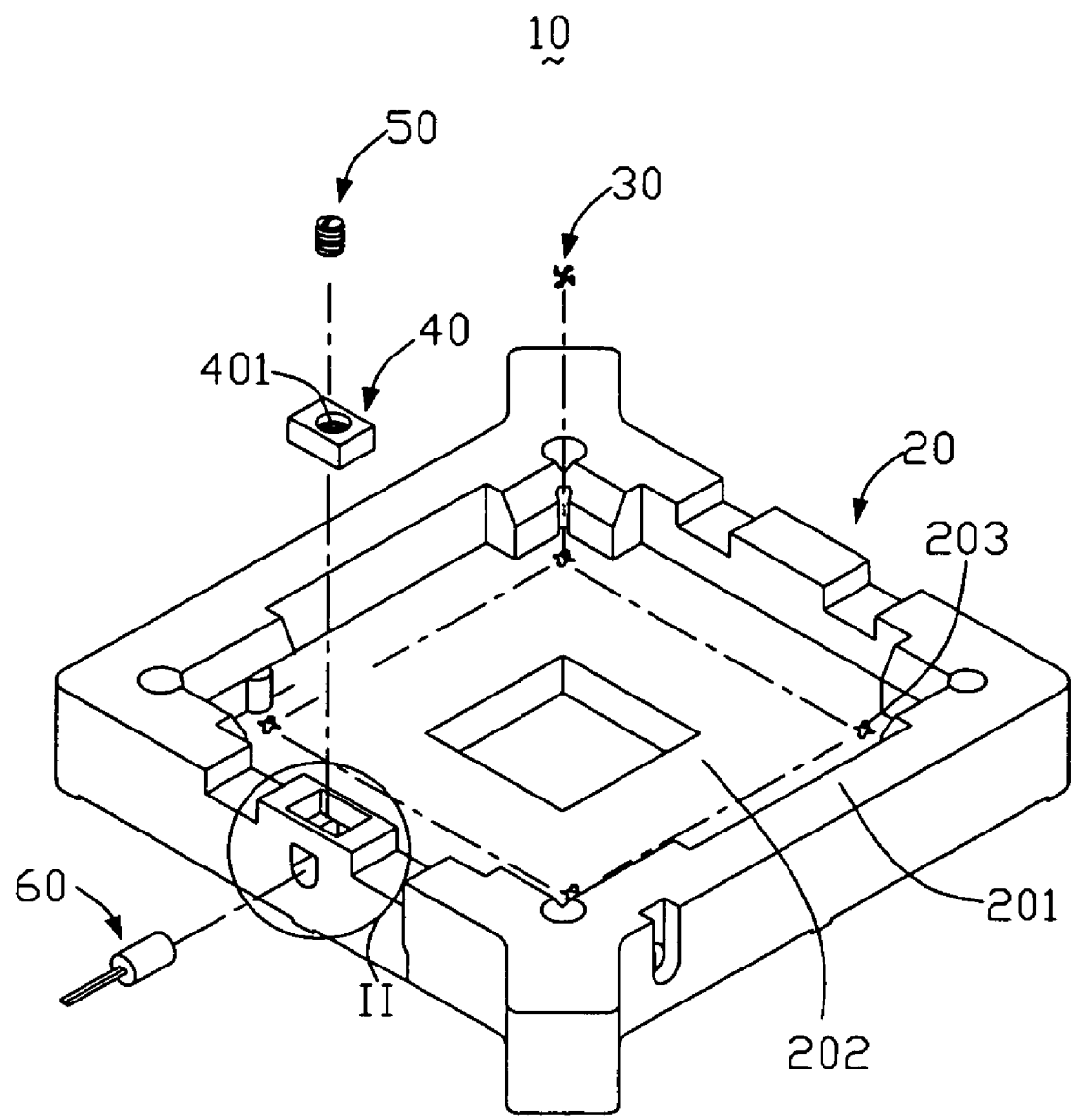
FIG. 1 is a simplified, exploded, isometric view of an IC socket in accordance with the preferred embodiment of the present invention.
Figure 2:
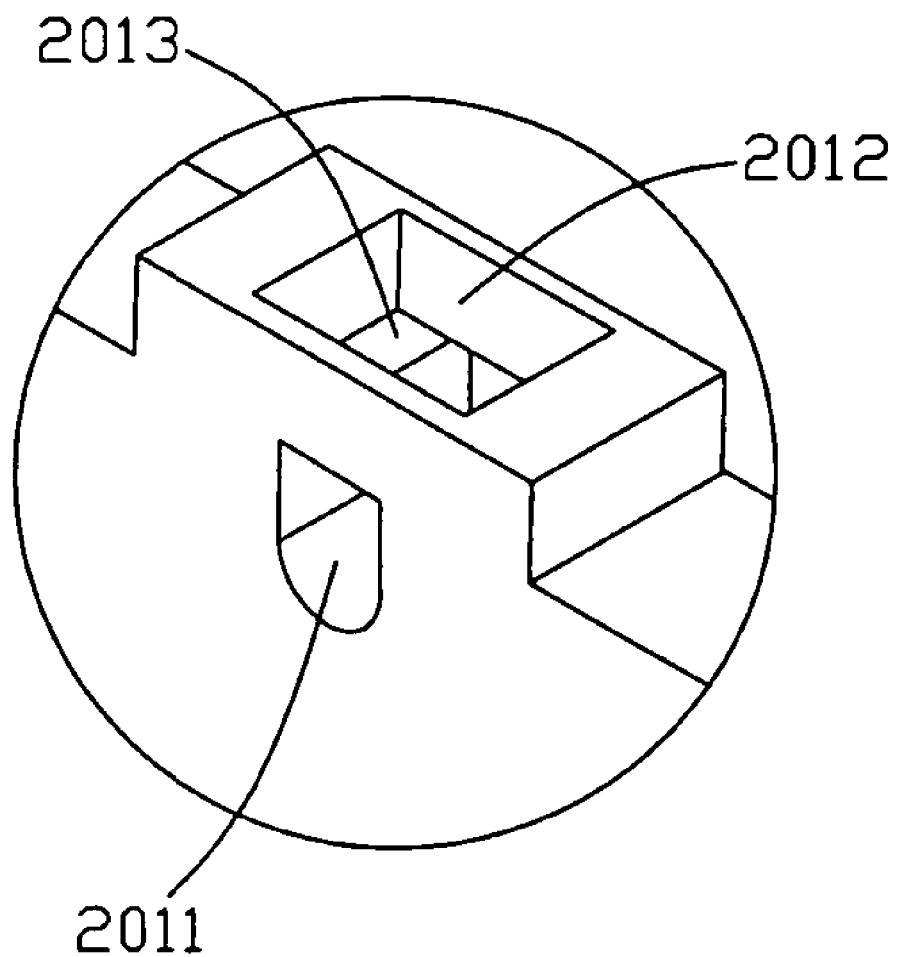
FIG. 2 is an enlarged view of a circled portion II of FIG. 1.
Figure 3:
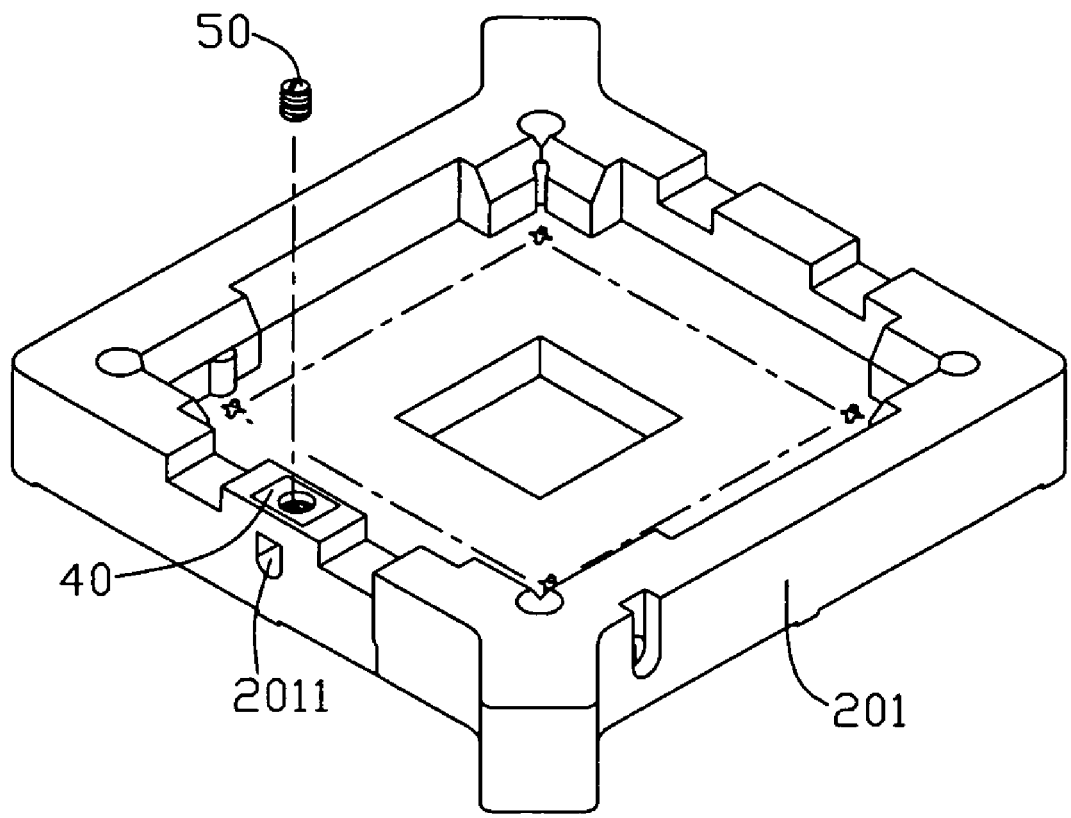
FIG. 3 is a partially assembled view of FIG. 1.
Figure 4:
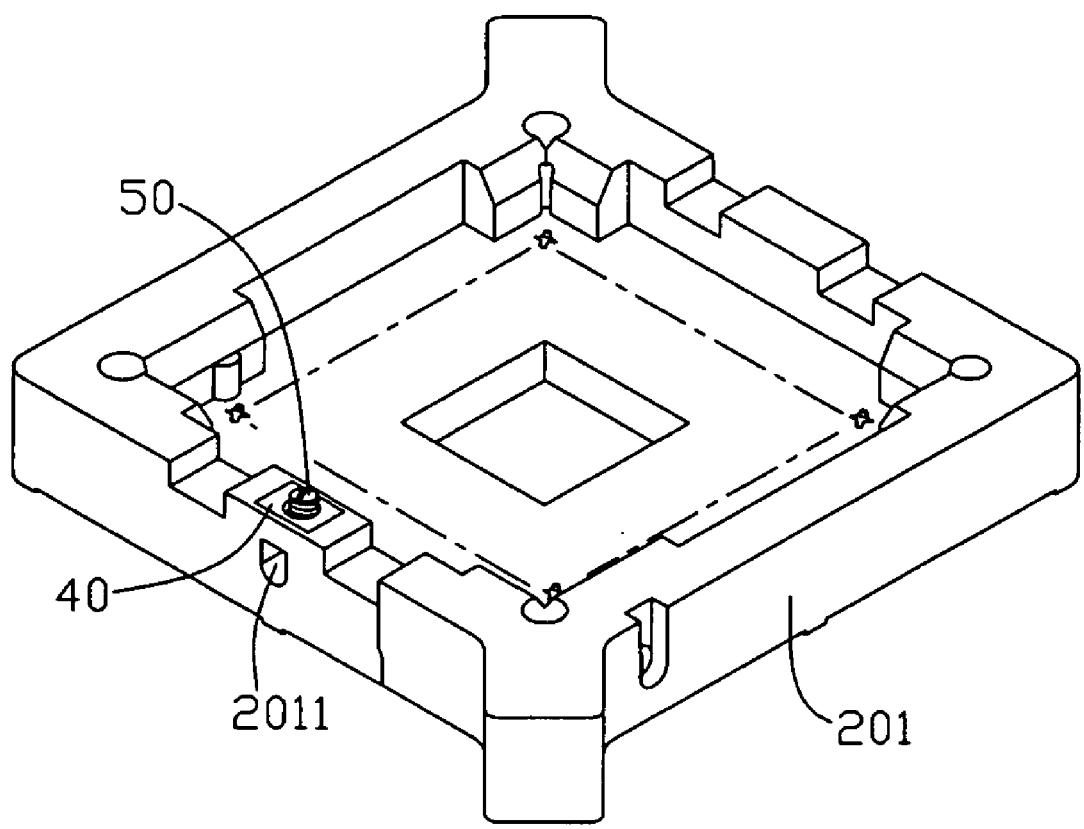
FIG. 4 is an assembled view of FIG. 1.

Referring to FIGS. 1-2, an IC socket 10 in accordance with the preferred embodiment of the present invention comprises an insulative housing 20, a multiplicity of conductive contacts 30 received in the housing 20, a sleeve 40 received by the housing 20, and a fastener 50 cooperating with the sleeve 40.

The housing 20 comprises a recessed area 202 defining a multiplicity of passageways 203 for receiving the contacts 30 therein, and two pairs of sidewalls 201 adjoining and cooperatively surrounding the recessed area 203 wherein a cavity (not labeled) is formed among the sidewalls 122 and above the recessed area 120 for receiving the IC.

Figure 5:
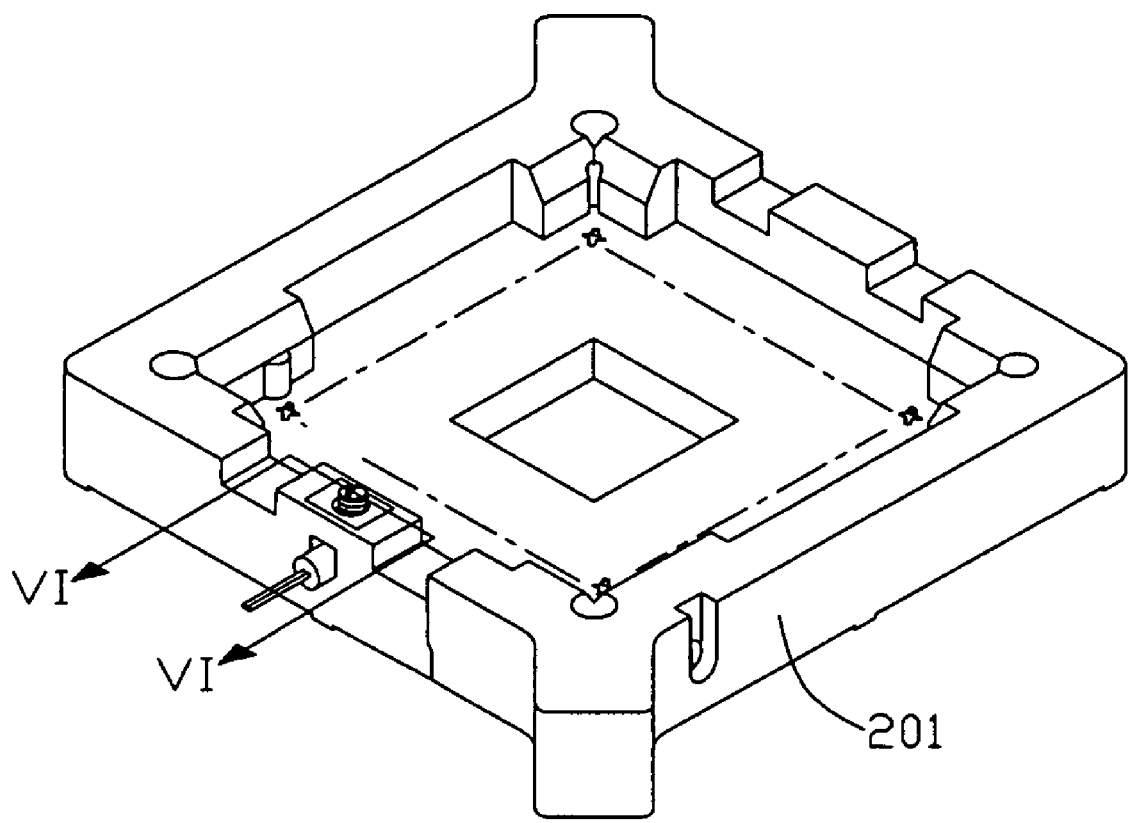
FIG. 5 is a view similar to FIG. 4, but showing a sensor attached in the socket.
Figure 6:
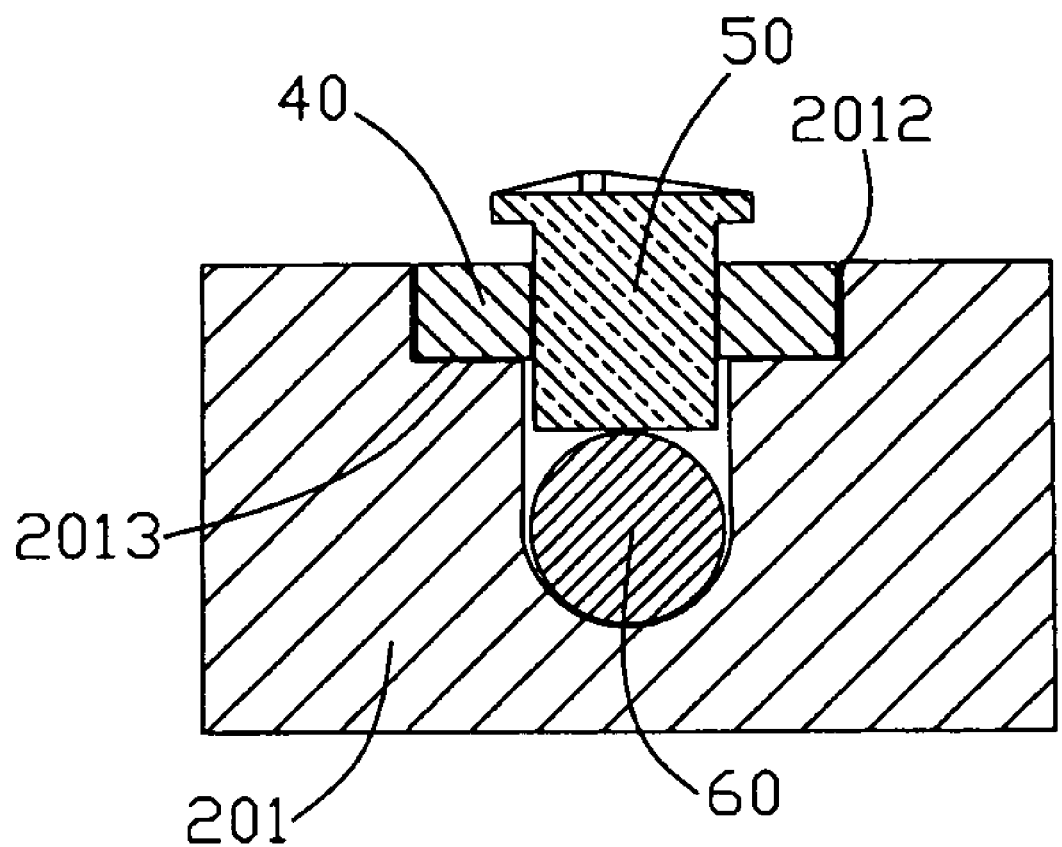
FIG. 6 is a plan view of a cross-section taken along line VI-VI in FIG. 5.

One of the sidewalls 201 defines a horizontal receiving channel 2011 in a middle portion thereof, and a vertical fastening channel 2012 communicating with the receiving channel 2011. A step 2013 is formed between the receiving channel 2011 and the fastening channel 2012. The sleeve 40 has an internal thread 401 and is separately positioned in the fastening channel 2012 from above by way of an interference fit. The fastener 50, a bolt in this embodiment, is screwed to the sleeve 40 to engage with a sensor 60 (FIG. 5 or 6).

Referring to FIGS. 3-6, when the IC socket 10 is used, the sensor 60 is required to attached to the IC socket 10 in order to provide an operator with burn-in data such as temperature of the ambient environment and position of the IC engaged on the IC socket 10. In assembly, first the sensor 60 is placed in the receiving channel 2011. Then the bolt 50 is screwed to the sleeve 40 until it presses on the sensor 60. Thus, the sensor 60 is tightly held in a proper position by the bolt 50. The bolt 50 is retained in the housing 20 by the thread 401 of the sleeve 40, which ensures that the bolt 50 remains in position in the housing 20. The sensor 60 is tightly and reliably attached to the IC socket 10. The sleeve 40 protects said one of the sidewalls 201 from being-damaged by the bolt 50. It is noted that the arch-like receiving channel 2011 allows to form the step 2013 and the fastening channel 2012 in the linear lines arrangement for efficiently holding the sleeve 40 thereon.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. In an IC socket for electrically connecting an integrated circuit module to a printed circuit board comprising: an insulative housing defining two pairs of sidewalls, said sidewalls forming a recessed area defining a plurality of passageways therein, one of the sidewalls of the housing forms a receiving channel and a fastening channel communicating with the receiving channel; a plurality of conductive contacts received in corresponding passageways; and a fastener to be mounted in the fastening channel, the improvement wherein:

a separate sleeve is interferentially disposed in the fastening channel and the fastener is screwed in the sleeve.

2. The IC socket as described in claim 1, wherein a step is formed between the receiving channel and the fastening channel and the sleeve rests upon the step.

3. The IC socket as described in claim 1, wherein the fastener is oriented vertical relative to the recessed area and receiving channel is oriented parallel to the recessed area.

4. In an IC socket assembly for electrically connecting an integrated circuit module to a printed circuit board comprising: an insulative housing defining a cavity located above a recessed area for receiving said integrated circuit module; a plurality of passageways defined in the recessed area; a plurality of conductive contacts received in corresponding passageways for connecting to the integrated circuit module; a receiving channel formed in the housing to communicate the cavity with an exterior; a fastening channel formed in the housing in communication with the receiving channel; a detecting device received in the receiving channel with a wire connected to an external device located in the exterior; and a fastening device extending into the fastening channel for fastening the detecting device in position in the housing, the improvement wherein:

a separate sleeve is interferentially disposed in the fastening channel and the fastening device is secured in the sleeve.

5. An IC socket assembly comprising:

an insulative housing defining a receiving cavity surrounded by a plurality of side walls;

at least one side wall defining:

a receiving channel extending through one of the side walls laterally to communicate an exterior and the cavity laterally;

a detecting device laterally disposed in the receiving channel;

a fastening channel downwardly extending from a top face of said one of the side walls with a sufficient distance to reach said receiving channel;

a discrete sleeve downwardly retainably installed into the fastening channel;

a fastening device extending downwardly through said sleeve and downwardly abutting against the detecting device.

6. The assembly as claimed in claim 5, wherein the receiving channel is of an upside-down arch-like configuration.

7. The assembly as claimed in claim 5, wherein the fastening device extends downwardly beyond the fastening channel.

8. The assembly as claimed in claim 5, wherein the fastening channel is located on the receiving channel by sharing a same rectangular interface therebetween.

9. The assembly as claimed in claim 5, wherein at least one step of said one of the side walls is formed on a bottom face of said fastening channel for holding said sleeve thereon.

* * * * *